(12) United States Patent
Zhou

(10) Patent No.: US 10,461,188 B2
(45) Date of Patent: Oct. 29, 2019

(54) SEMICONDUCTOR DEVICE AND MANUFACTURING METHOD THEREFOR

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing Int. (Beijing) Corp., Beijing (CN); Semiconductor Manufacturing Int. (Shanghai) Corp., Shanghai (CN)

( * ) Notice: Subject to any disclaimer, the term of this patent is extended or adjusted under 35 U.S.C. 154(b) by 0 days.

(21) Appl. No.: 15/814,154

(22) Filed: Nov. 15, 2017

(65) Prior Publication Data
US 2018/0145172 A1    May 24, 2018

(30) Foreign Application Priority Data

Nov. 23, 2016  (CN) .......................... 2016 1 1046396

(51) Int. Cl.
*H01L 29/78*  (2006.01)
*H01L 21/02*  (2006.01)
(Continued)

(52) U.S. Cl.
CPC .... *H01L 29/7833* (2013.01); *H01L 21/02008* (2013.01); *H01L 21/02107* (2013.01);
(Continued)

(58) Field of Classification Search
CPC ....... H01L 21/823468; H01L 21/02008; H01L 21/02108; H01L 21/823418; H01L 21/268;
(Continued)

(56) References Cited

U.S. PATENT DOCUMENTS 9,105,742 B1    8/2015  Basker et al.
2007/0287259 A1  12/2007  Kavalieros et al.
(Continued)

FOREIGN PATENT DOCUMENTS

EP        0 932 197 A1    7/1999

OTHER PUBLICATIONS

Extended European Search Report dated Mar. 18, 2018 for EP Application No. 17 20 2699.9 (10 pp.).

*Primary Examiner* — Galina G Yushina
(74) *Attorney, Agent, or Firm* — Brinks Gilson & Lione

(57) ABSTRACT

The present disclosure relates to the technical field of semiconductors, and discloses a semiconductor device and a manufacturing method therefor. The method includes: providing a substrate structure, where the substrate structure includes: a substrate having a first device region and a second device region, a first dummy gate structure at the first device region, a second dummy gate structure at the second device region, and an LDD region below the first dummy gate structure. The first dummy gate structure includes a first dummy gate dielectric layer at the first device region, a first dummy gate on the first dummy gate dielectric layer, and a first spacer layer at a side wall of the first dummy gate. The second dummy gate structure includes a second dummy gate dielectric layer at the second device region, a second dummy gate on the second dummy gate dielectric layer, and a second spacer layer at a side wall of the second dummy gate. The method further includes removing the first dummy gate; etching back the first spacer layer to reduce a thickness of the first spacer layer; removing an exposed portion of the first dummy gate dielectric layer to form a first trench; and removing the second dummy gate and exposed second dummy gate dielectric layer to form a second trench.

7 Claims, 10 Drawing Sheets

(51) Int. Cl.
*H01L 21/8234* (2006.01)
*H01L 29/66* (2006.01)
*H01L 27/088* (2006.01)

(52) U.S. Cl.
CPC .. *H01L 21/823468* (2013.01); *H01L 27/0886* (2013.01); *H01L 29/6653* (2013.01); *H01L 29/66545* (2013.01); *H01L 29/785* (2013.01); *H01L 29/7836* (2013.01); *H01L 21/823418* (2013.01)

(58) Field of Classification Search
CPC ..... H01L 21/823814; H01L 21/823821; H01L 29/7833; H01L 29/6653; H01L 29/66545; H01L 29/66795; H01L 29/66803; H01L 29/7854; H01L 29/78621
See application file for complete search history.

(56) References Cited

U.S. PATENT DOCUMENTS

| | | | | |
|---|---|---|---|---|
| 2008/0237734 | A1* | 10/2008 | Hung | H01L 21/823807 257/374 |
| 2013/0175611 | A1* | 7/2013 | Shinohara | H01L 21/02697 257/334 |
| 2014/0179076 | A1 | 6/2014 | Shinohara | |
| 2015/0001468 | A1* | 1/2015 | Huang | H01L 29/66977 257/24 |
| 2015/0069516 | A1 | 3/2015 | Lenox et al. | |
| 2015/0243564 | A1* | 8/2015 | Zhao | H01L 29/66545 438/591 |
| 2015/0318354 | A1* | 11/2015 | Yin | H01L 29/785 257/288 |
| 2016/0079124 | A1 | 3/2016 | Yin et al. | |
| 2016/0087063 | A1* | 3/2016 | Yin | H01L 29/4916 257/344 |

* cited by examiner

US 10,461,188 B2

SEMICONDUCTOR DEVICE AND MANUFACTURING METHOD THEREFOR

RELATED APPLICATION

The present application claims priority to Chinese Patent Appln. No. 201611046396.9, filed Nov. 23, 2016, the entirety of which is hereby incorporated by reference.

BACKGROUND

Technical Field

The present disclosure relates to a technical field of semiconductors, and more particularly to a semiconductor device and a manufacturing method therefor.

Related Art

With a critical dimension of a metal oxide semiconductor field effect transistor (Metal Oxide Semiconductor Field Effect Transistor, MOSFET) decreasing, Short Channel Effect (Short Channel Effect, SCE) becomes a critical factor that affects device performances. A Fin Field Effect Transistor (Fin Field Effect Transistor, FinFET) has a better gate control ability, and can effectively suppress the short channel effect. Therefore, often a FinFET device is used in designing a semiconductor element of a smaller dimension.

Regarding a System-On-a-Chip (System-On-a-Chip, SOC), different types of devices may need to be manufactured at the same time. For example, an input/output (I/O) device and a core device may need to be manufactured at the same time. To control a short channel effect of a core device, a smaller thermal budget is required. However, a smaller thermal budget results in an overlapping area of a Lightly Doped Drain (LDD) region and a channel region of the I/O device being smaller, thereby reducing a reliability of the I/O device. Other devices that are manufactured at the same time may experience the same problems.

SUMMARY

An object of the present disclosure is improving device reliability. In one form of the present disclosure, a method for manufacturing a semiconductor device is provided. The method includes providing a substrate structure, where the substrate structure includes: a substrate having a first device region and a second device region, a first dummy gate structure at the first device region, a second dummy gate structure at the second device region, and a Lightly Doped Drain (LDD) region below the first dummy gate structure. The first dummy gate structure includes a first dummy gate dielectric layer at the first device region, a first dummy gate on the first dummy gate dielectric layer, and a first spacer layer at a side wall of the first dummy gate. The second dummy gate structure including a second dummy gate dielectric layer at the second device region, a second dummy gate on the second dummy gate dielectric layer, and a second spacer layer at a side wall of the second dummy gate. The method further includes removing the first dummy gate; etching back the first spacer layer to reduce a thickness of the first spacer layer; removing an exposed portion of the first dummy gate dielectric layer to form a first trench, and removing the second dummy gate and exposed second dummy gate dielectric layer to form a second trench.

In some implementations, the method further includes: depositing a gate dielectric layer to cover a bottom portion and a side wall of the first trench and a bottom portion and a side wall of the second trench; and depositing a gate material on the gate dielectric layer.

In some implementations, the method further includes: before depositing a gate dielectric layer, forming an interface layer at the bottom portion of the first trench and the bottom portion of the second trench.

In some implementations, the method further includes: before depositing a gate dielectric layer, forming a gate oxide layer at the bottom portion of the first trench.

In some implementations, the first device region includes an I/O device region, and the second device region includes a core device region.

In some implementations, the first device region includes a first semiconductor region and a first semiconductor fin at the first semiconductor region; and the second device region includes a second semiconductor region and a second semiconductor fin at the second semiconductor region, where the first dummy gate structure spans over the first semiconductor fin and the second dummy gate structure spans over the second semiconductor fin.

In some implementations, providing a substrate structure may include: providing an initial the substrate; etching the initial substrate to form the first device region and the second device region; forming an isolation region between various semiconductor fins, where a top surface of the isolation region is lower than a top surface of each semiconductor fin; forming dummy gate dielectric layers at surfaces of portions of the various semiconductor fins that are located above the isolation region; depositing a dummy gate material and patterning the dummy gate material to form the first dummy gate and the second dummy gate; forming the first spacer layer at side walls of the first dummy gate and the first dummy gate dielectric layer, and forming the second spacer layer at side walls of the second dummy gate and the second dummy gate dielectric layer; performing LDD injection using the first spacer layer as a mask to form the LDD region to form a first structure; depositing an inter layer dielectric layer on the first structure; and planarizing the interlayer dielectric layer to expose the first dummy gate and the second dummy gate.

In some implementations, depositing an interlayer dielectric layer on the first structure may include: depositing a contact etch stop layer on the first structure; and depositing the interlayer dielectric layer on the contact etch stop layer.

In another form of the present disclosure, a semiconductor device is provided, including: a substrate having a first device region and a second device region; a first trench at the first device region; a first spacer layer at a side wall of the first trench; an LDD region below the first trench; a second trench at the second device region; and a second spacer layer at a side wall of the second trench, where a thickness of the first spacer layer is smaller than a thickness of the second spacer layer.

In some implementations, the device further includes a first gate structure and a second gate structure, where the first gate structure includes a first gate dielectric layer at a bottom portion and a side wall of the first trench, and a first gate electrode on the first gate dielectric layer; and the second gate structure includes a second gate dielectric layer at a bottom portion and a side wall of the second trench, and a second gate electrode on the second gate dielectric layer.

In some implementations, the first device region includes a first semiconductor region and a first semiconductor fin at the first semiconductor region; and the second device region includes a second semiconductor region and a second semiconductor fin at the second semiconductor region, where the first gate structure spans over the first semiconductor fin, and the second gate structure spans over the second semiconductor fin.

In some implementations, the device further includes: an interface layer between the bottom portion of the first trench and the first gate dielectric layer, and between the bottom portion of the second trench and the second gate dielectric layer.

In some implementations, the first gate structure further includes a gate oxide layer between the bottom portion of the first trench and the first gate dielectric layer.

In some implementations, the first device region includes an I/O device region, and the second device region includes a core device region.

In yet another form of the present disclosure, a method for manufacturing a semiconductor device is provided, including: providing a substrate structure, where the substrate structure includes: a substrate, a dummy gate structure on the substrate; and a Lightly Doped Drain (LDD) region below the dummy gate structure. The dummy gate structure includes a dummy gate dielectric layer on the substrate, a dummy gate on the dummy gate dielectric layer, and a spacer layer at a side wall of the dummy gate. The method further includes removing the dummy gate; etching back the spacer layer, so as to reduce thickness of the spacer layer; and removing exposed dummy gate dielectric layer, so as to from a trench.

In implementations of methods for manufacturing a semiconductor device provided by the present disclosure, a first dummy gate is first removed. Then a thickness of a first spacer layer is reduced by etching it back, and then, a second dummy gate and exposed second dummy gate dielectric layer are removed. Compared with simultaneously removing the first dummy gate and the second dummy gate as in the prior art, implementations of methods of the present disclosure, in a case in which thermal budget is not added, may increase an overlapping area of a channel region and an LDD region of a first device after a gate electrode is subsequently formed, so as to improve reliability of the device.

In light of the following detailed descriptions of embodiments and implementations of the present disclosure for illustration purposes with reference to the accompanying drawings, other characters, aspects, and advantages of the present invention become clear.

BRIEF DESCRIPTION OF THE DRAWINGS

The accompanying drawings form a part of the specification, assist in describing embodiments and implementations of the present disclosure for illustration purposes, and are used to explain the principles of the present disclosure together with the specification. In the accompanying drawings.

DETAILED DESCRIPTION

Embodiments and implementations of the present disclosure are described in detail for illustration purposes with reference to the accompanying drawings. It should be noted that unless being described in detail, relative layouts, mathematical expressions, and numeric values of components and steps described in these embodiments and implementations should not be understood as a limitation to the scope of the present disclosure.

In addition, it should be understood that for ease of description, sizes of the parts shown in the accompanying drawings are not necessarily drawn according to an actual proportional relationship. For example, thicknesses or widths of some layers may be magnified with respect to other layers.

The following description about the embodiments and implementations of the present disclosure are presented for illustration purposes only, and should not be used as a limitation on the present disclosure and applications or uses of the present disclosure in any sense.

Technologies, methods, and devices that are known by a person of ordinary skill in the related fields may not be discussed in detail. However, in cases in which the technologies, methods, and devices are applicable, the technologies, methods, and devices should be considered as a part of the description.

It should be noted that similar reference signs and letters are used to represent similar items in the following accompanying drawings. Therefore, once an item is defined or described in a figure, the item needs not to be further discussed in the description of the subsequent figures.

Regarding the foregoing problem, the inventor has found that to increase an overlapping area of an LDD region and a channel region, dose of injecting the LDD may be increased. However, after the dose of injecting the LDD is increased, a reliability of some devices such as an I/O device may decrease. On this basis, the inventor provides the following solutions to address this problem.

Figure 1:
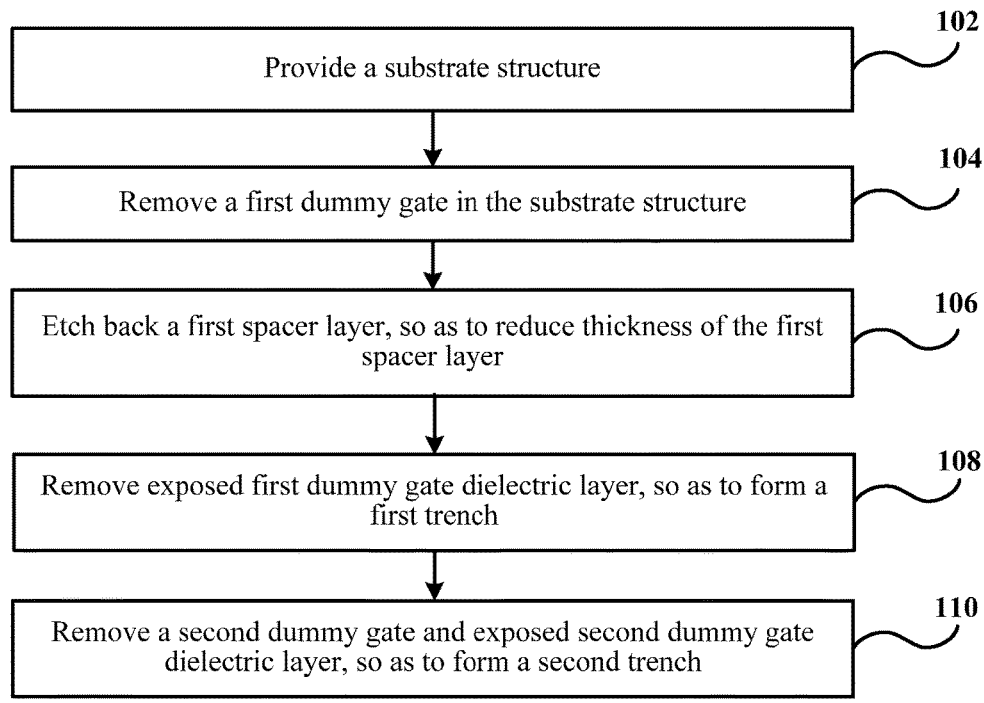
FIG. 1 is a simplified flowchart of a method for manufacturing a semiconductor device.

FIG. 1 is a simplified flowchart of a method for manufacturing a semiconductor device. As shown in FIG. 1, in step 102, a substrate structure is provided.

Figure 2:
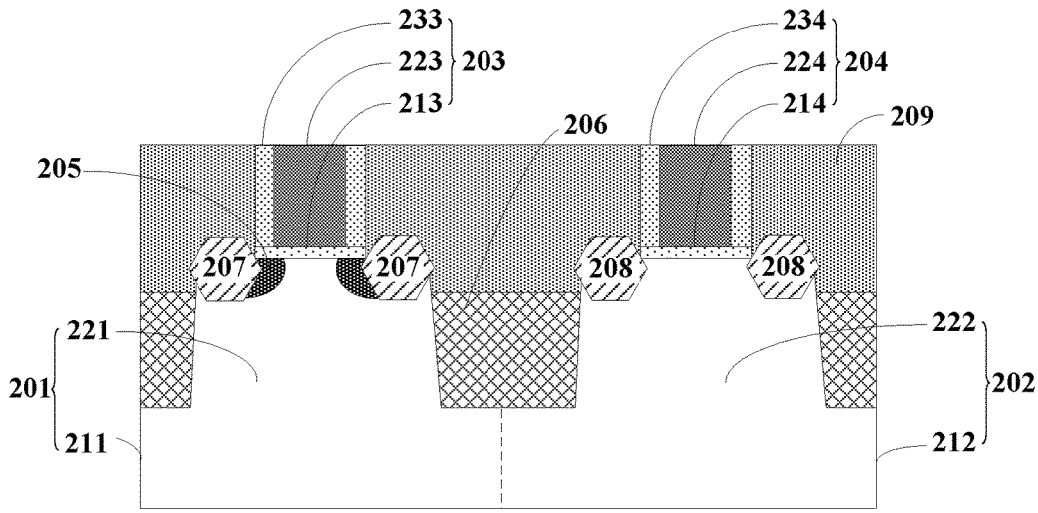
FIG. 2 to FIG. 6 show schematic sectional diagrams of various phases of a method for manufacturing a semiconductor device.

FIG. 2 shows a schematic sectional diagram of one implementation of a substrate structure. As shown in FIG. 2, the substrate structure includes: a substrate having a first device region 201 and a second device region 202, a first dummy gate structure 203 at the first device region 201, a second dummy gate structure 204 at the second device region 202 and a Lightly Doped Drain (LDD) region 205 in the substrate below the first dummy gate structure 203. The LDD region 205 facilitates to reduce Hot Carrier Effect (Hot Carrier Effect, HCE). It should be understood that the substrate below the second dummy gate structure 204 may also be provided with an LDD region. In some implementations, the first device region 201, for example, may include an input/output (I/O) device region, and the second device region, for example, may include a core device region. The first device region 201 and the second device region 202 may be separated by using an isolation region 206, such as a shallow trench isolation (STI) region. In addition, the substrate structure may further include a raised first source/drain region 207 at two sides of the first dummy gate structure 203 and a second source/drain region 208 at two sides of the second dummy gate structure 204. In addition, an interlayer dielectric (ILD) layer 209 may be provided above the isolation region 206.

As shown in FIG. 2, the first dummy gate structure 203 includes a first dummy gate dielectric layer 213 (such as an oxide of silicon) at the first device region 201, a first dummy gate 223 (such as polysilicon) on the first dummy gate dielectric layer 213, and a first spacer layer 233 (such as a nitride of silicon) at a side wall of the first dummy gate 223. The second dummy gate structure 204 includes a second dummy gate dielectric layer 214 (such as an oxide of silicon) at the second device region 202, a second dummy gate 224 (such as polysilicon) on the second dummy gate dielectric layer 214, and a second spacer layer 234 (such as a nitride of silicon) at a side wall of the second dummy gate 224. It should be understood that the first spacer layer 233 may also be on the first dummy gate dielectric layer 213, and the second spacer layer 234 may also be on the second dummy gate dielectric layer 214.

In some implementations, as shown in FIG. 2, the first device region 201 may include a first semiconductor region 211 and a first semiconductor fin 221 at the first semiconductor region 211, and the second device region 202 may include a second semiconductor region 212 and a second semiconductor fin 222 at the second semiconductor region 212. In such a case, the first dummy gate structure 203 may span over the first semiconductor fin 221 and the second dummy gate structure 204 may span over the second semiconductor fin 222. It should be noted that in the present context, the term "span" is understood as the following: for example, the first dummy gate structure spans over the first semiconductor fin refers to that an upper surface and a side wall of a portion above the first semiconductor fin are both formed with the first dummy gate structure, and the first dummy gate structure is further formed at a part of the surface of the first semiconductor region.

Figure 3:
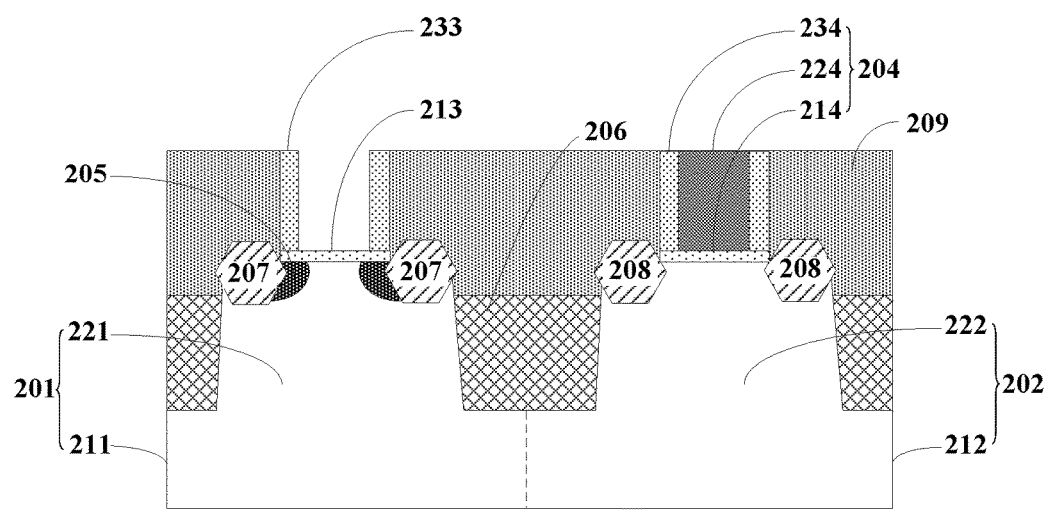

Subsequently, in step 104, the first dummy gate 223 is removed. For example, the first dummy gate 223 may be removed using dry etching to expose the first spacer layer 233, as shown in FIG. 3.

Figure 4:
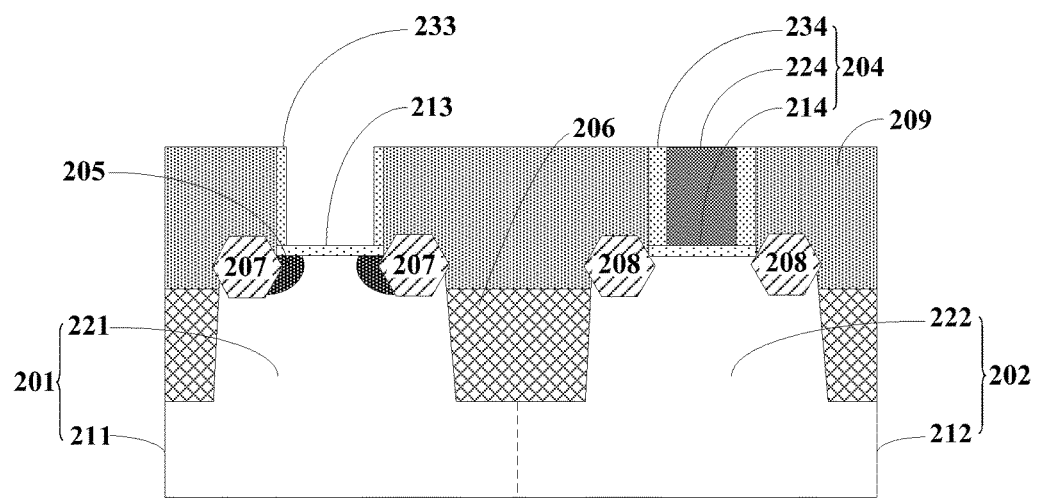

Subsequently, in step 106, the first spacer layer 233 is etched back to reduce a thickness of the first spacer layer 233, as shown in FIG. 4.

Figure 5:
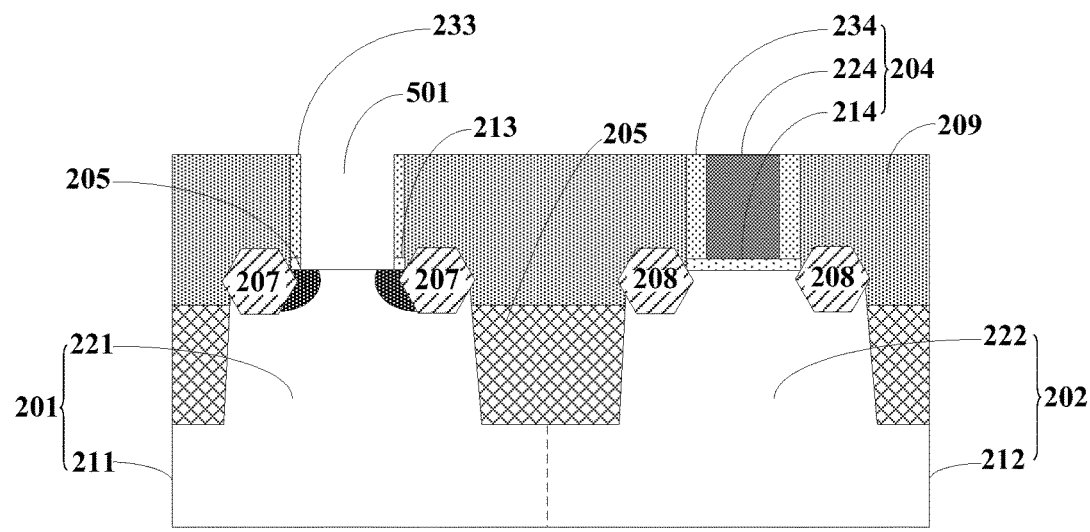

Subsequently, in step 108, the exposed first dummy gate dielectric layer 213 is removed to form a first trench 501, as shown in FIG. 5. It should be understood that when removing the exposed first dummy gate dielectric layer 213, a part of the first dummy gate dielectric layer 213 which is located below the first spacer layer 233 may also be removed. For example, a width of the first spacer layer 233 (width along a direction of a channel) may be about 50-80 angstroms, and a width of the first dummy gate dielectric layer 213 (width along a direction of a channel) below the first spacer layer 233 may be about 30 angstroms.

Figure 6:
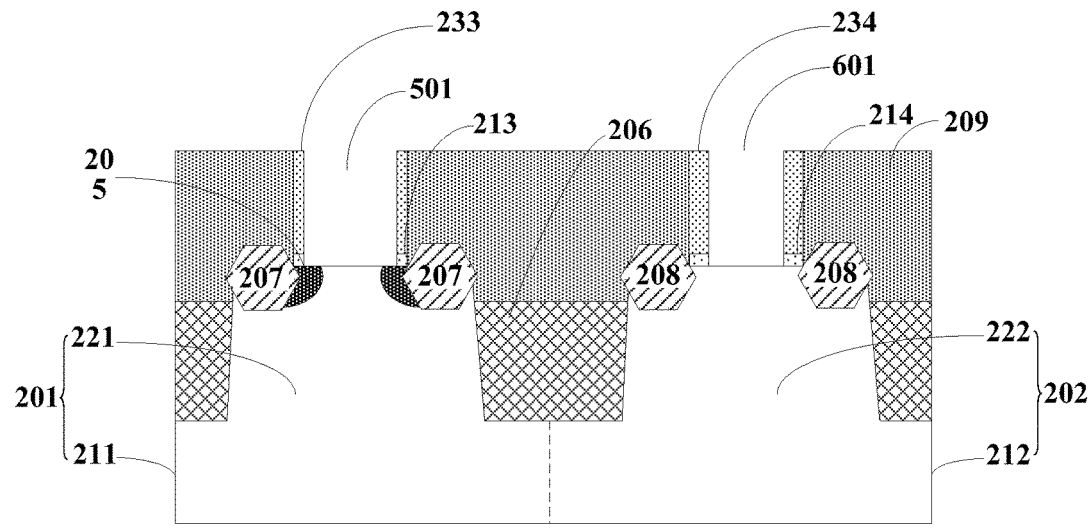

Subsequently, in step 110, the second dummy gate 224 and the exposed second dummy gate dielectric layer 214 are removed to form a second trench 601, as shown in FIG. 6. Similar to the above, in some implementations, when removing the exposed second dummy gate dielectric layer 214, a part of the second dummy gate dielectric layer 214 which is located below the second spacer layer 234 may also be removed.

One method for manufacturing a semiconductor device is described above. In the described method, a first dummy gate is removed, then a thickness of a first spacer layer is reduced by etching it back, and then a second dummy gate and an exposed second dummy gate dielectric layer are removed. Compared with simultaneously removing the first dummy gate and the second dummy gate in the prior art, the method of this implementation, in a case in which thermal budget is not added, may increase an overlapping area of a channel region and an LDD region of a first device after a gate electrode is subsequently formed, so as to improve reliability of the device.

Corresponding to the foregoing method, the present disclosure provides a semiconductor device. With reference to FIG. 6, the semiconductor device may include: a substrate having a first device region 201 and a second device region 202; a first trench 501 at the first device region 201; a first spacer layer 233 at a side wall of the first trench 501; an LDD region 205 below the first trench; a second trench 601 at the second device region 202; and a second spacer layer 234 at a side wall of the second trench 601. Herein, a thickness of the first spacer layer 233 is smaller than a thickness of the second spacer layer 234.

For example, the first device region 201 may be an I/O device region, and the second device region 202 may be a core device region. In one implementation, with reference to FIG. 6, the first device region 201 may include a first semiconductor region 211 and a first semiconductor fin 221 at the first semiconductor region 211; and the second device region 202 may include a second semiconductor region 212 and a second semiconductor fin 222 at the second semiconductor region 212.

Figure 7:
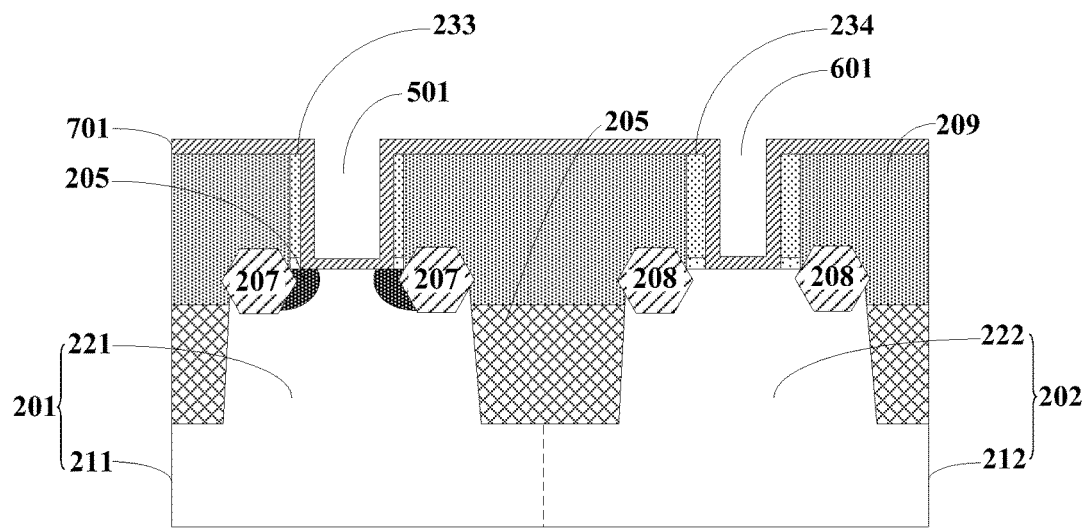
FIG. 7 to FIG. 9 show schematic sectional diagrams of various phases of another method for manufacturing a semiconductor device.

In some embodiments, after the first trench 501 and the second trench 601 shown in FIG. 6 are formed, the foregoing manufacturing method may further include the following steps:

Depositing a gate dielectric layer 701 to cover a bottom portion and a side wall of the first trench 501 and a bottom portion and a side wall of the second trench 601, as shown in FIG. 7. Preferably, the gate dielectric layer 701 may include a high K dielectric layer with high K dielectric materials such as hafnium oxide, tantalum oxide, aluminum oxide, zirconium oxide, or titanium oxide. Preferably, before depositing the gate dielectric layer 701, an interface layer (Interface Layer, IL), such as a thermal oxide layer, at the bottom portion of the first trench 501 and/or the bottom portion of the second trench 601 may further be formed to improve interface properties between the gate dielectric layer 701 and the bottom surfaces of the first trench 501 and/or the second trench 502, thereby improving reliability of the gate dielectric layer 701.

Some devices, such as an I/O device, may need a gate dielectric layer thicker than a core device. Therefore, in some implementations, preferably, before depositing the gate dielectric layer 701, a gate oxide layer may further be formed at the bottom portion of the first trench 501, where the gate oxide layer and the gate dielectric layer 701 which is subsequently deposited together are used as a gate dielectric layer of a first device (for example, an I/O device). For example, the in-situ steam generation (in-situ steam generation, ISSG) process may be used to form the gate oxide layer at the bottom portion of the first trench 501.

Figure 8:
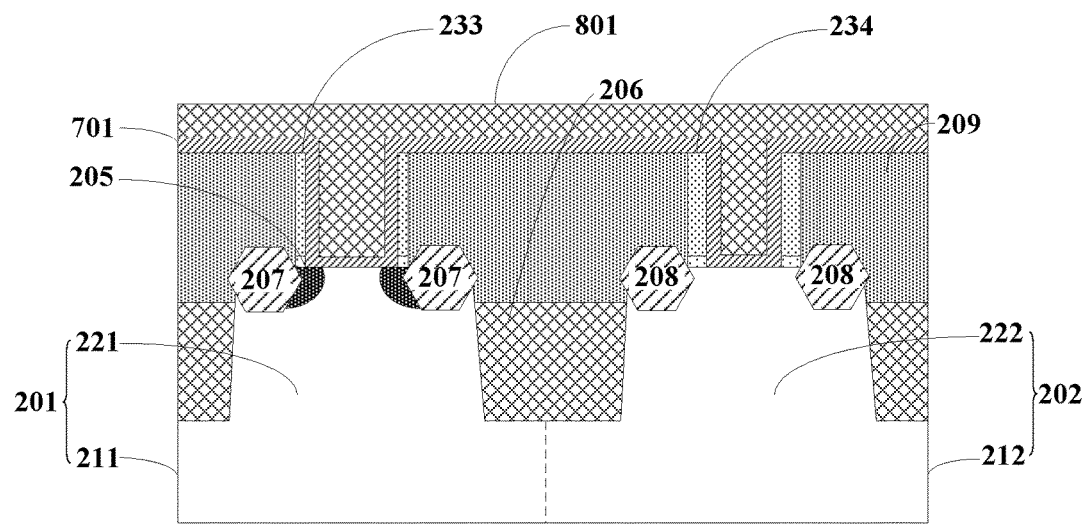

Subsequently, a gate material 801, for example, tungsten or other metallic materials, may be deposited on the gate dielectric layer 701, as shown in FIG. 8. In some implementations, a TiN cap layer may be first deposited on the gate dielectric layer 701, and then the gate material 801 is deposited on the TiN cap layer.

Figure 9:
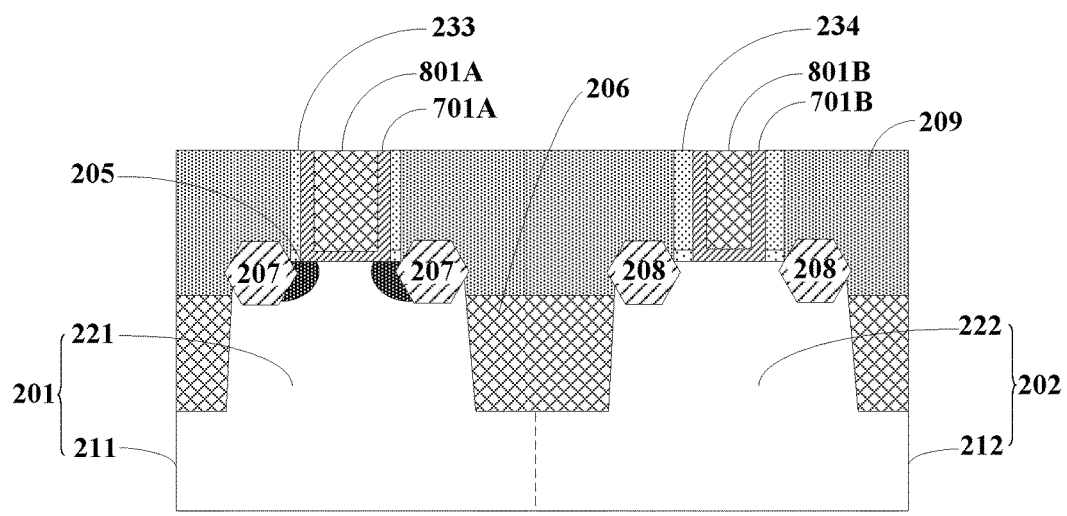

Subsequently, a planarization process such as chemical-mechanical polishing (CMP) may be performed until an interlayer dielectric layer 209 is exposed to form a first gate structure and a second gate structure, as shown in FIG. 9. Herein, the first gate structure includes a first gate dielectric layer 701A at a bottom portion and a side wall of the first trench 501, and a first gate electrode 801A on the first gate dielectric layer 701A. The second gate structure includes a second gate dielectric layer 701B at a bottom portion and a side wall of the second trench 502, and a second gate electrode 801B on the second gate dielectric layer 701B.

Correspondingly, the present disclosure further provides another semiconductor device, with reference to FIG. 9. Compared with the semiconductor device shown in FIG. 6, the semiconductor device shown in FIG. 9 may further include a first gate structure and a second gate structure. Reference may be made to the foregoing description for specific structures of the first gate structure and the second gate structure, and details are not described herein again.

In addition, as shown in FIG. 9, in a case in which the first device region 201 includes a first semiconductor fin 221 and the second device region 202 includes a second semiconductor fin 222, the first dummy gate structure may span over the first semiconductor fin 221, and the second dummy gate structure may span over the second semiconductor fin 222. In addition, in some implementations, the first gate structure may further include a gate oxide layer between the bottom portion of the first trench 501 and the first gate dielectric layer 701A.

In some implementations, the semiconductor device may further include an interface layer between the bottom portion of the first trench 501 and the first gate dielectric layer 701A, and between the bottom portion of the second trench 601 and the second gate dielectric layer 701B.

FIG. 10A to FIG. 10J show schematic sectional drawings of various phases for forming a substrate structure shown in FIG. 2. Detailed description is made in the following with reference to FIG. 10A to FIG. 10J.

First, an initial substrate is provided. The initial substrate is etched to form the first device region and the second device region.

Figure 10A:
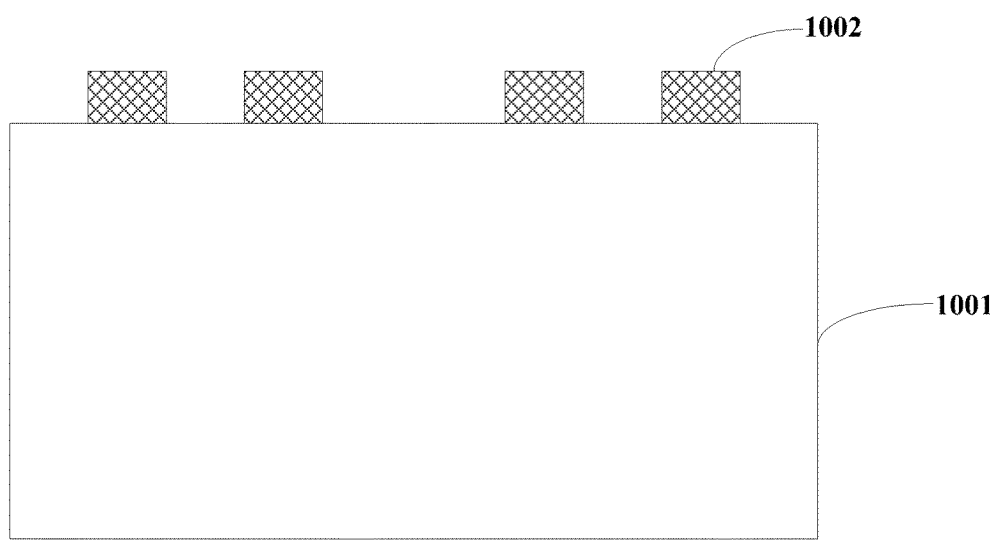
FIG. 10A to FIG. 10J show schematic sectional diagrams of various phases for forming a substrate structure shown in FIG. 2.

For example, as shown in FIG. 10A, a patterned hard mask 1002 may be formed on an initial substrate 1001. The initial substrate 1001 may be, for example, a semiconductor made of silicon (Si), germanium (Ge), or other elements, or may also be a semiconductor made of chemical compounds such as gallium arsenide (GaAs). A hard mask 1002 may be, for example, a nitride of silicon, an oxide of silicon, or a nitrogen oxide of silicon. However, the present disclosure is not limited thereto.

Figure 10B:
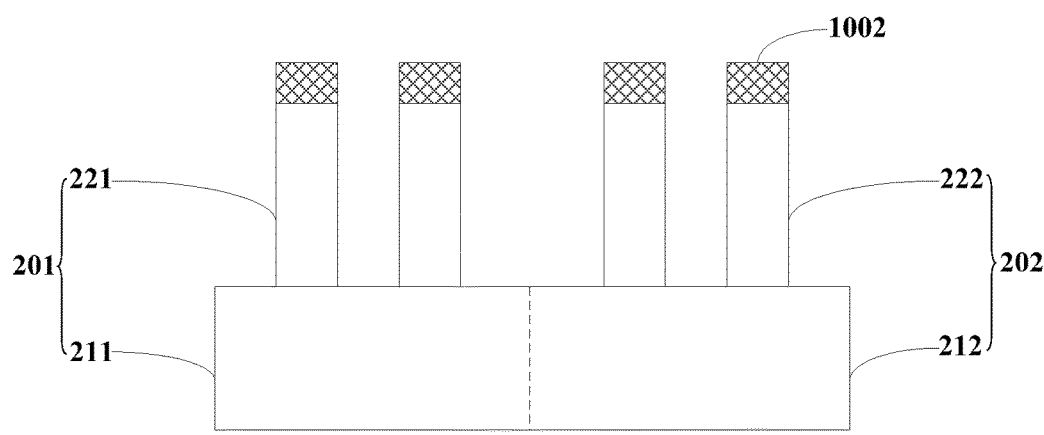

Following this, as shown in FIG. 10B, the initial substrate 1001 is etched using the hard mask as a mask to form a substrate having a first device region 201 and a second device region 202. The first device region 201 includes a first semiconductor region 211 and a first semiconductor fin 221 at the first semiconductor region 211. The second device region 202 includes a second semiconductor region 212 and a second semiconductor fin 222 at the second semiconductor region 212.

Subsequently, an isolation region is formed between various semiconductor fins, where a top surface of the isolation region is lower than a top surface of each semiconductor fin.

Figure 10C:
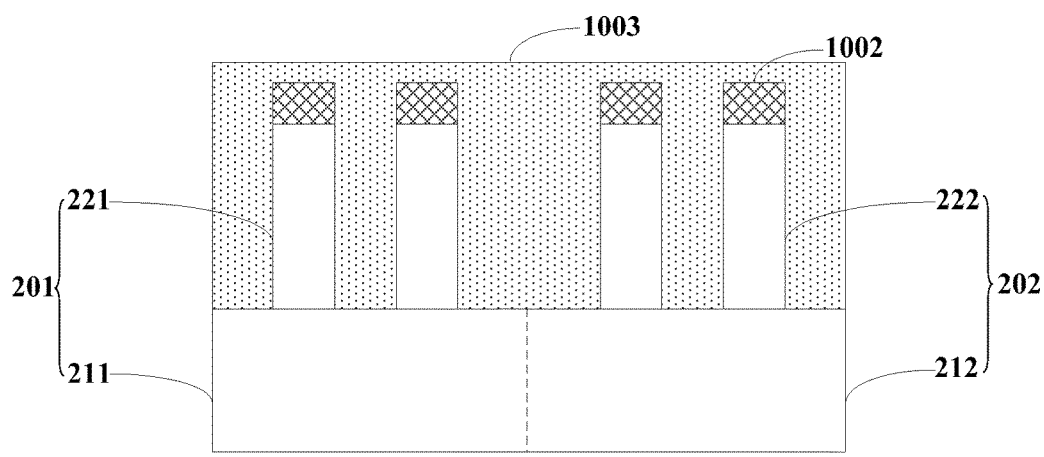

For example, as shown in FIG. 10C, an isolation material 1003 (for example, a dielectric material) may be deposited to fill up space between the various semiconductor fins and to cover the hard mask 1002. For example, the isolation material 1003 may be deposited using, for example, technologies such as chemical vapor deposition (CVD) of flowable chemical vapour deposition (Flowable Chemical Vapour Deposition, FCVD). Optionally, before the isolation material 1003 is deposited, a liner layer may further be formed at a surface of the substrate (that is, the first device region 201 and the second device region 202) (for example, forming a silicon oxide layer through thermal oxidation, not shown in the figures). The liner layer may repair surface damages caused to the first semiconductor fin 221 and the second semiconductor fin 222 when etching the initial substrate 1001. After the isolation material 1003 is deposited, planarization, for example, chemical-mechanical polishing, may further be performed to the isolation material 1003.

Figure 10D:
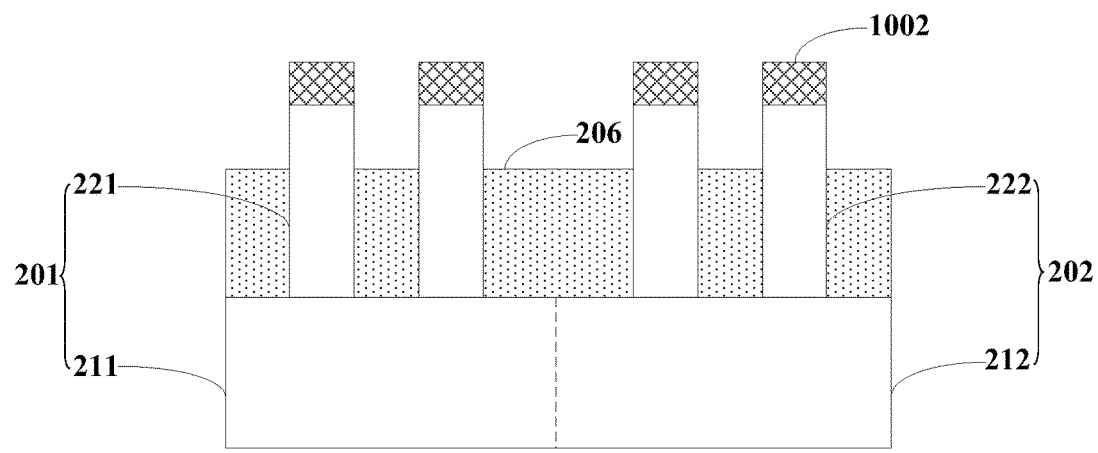
Figure 10E:
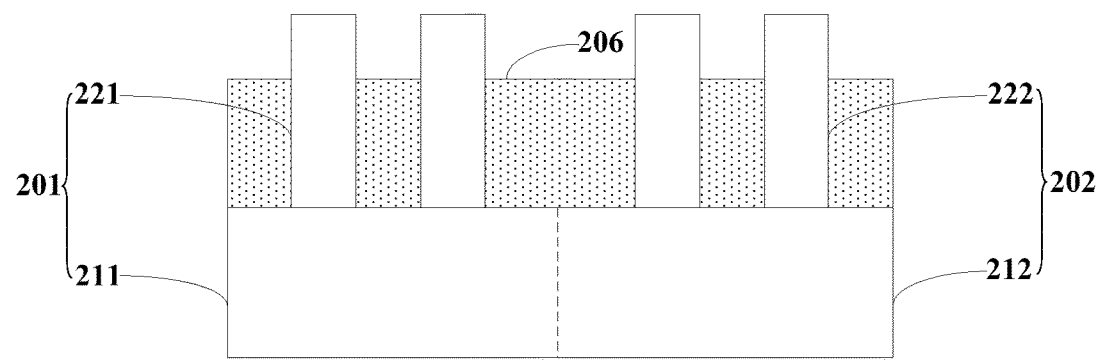

Following this, for example, as shown in FIG. 10D, the isolation material 1003 is etched back so that a height of the remaining isolation material 1003 reaches to an expected height, and the hard mask 1002 is exposed. Herein, the remaining isolation material 1003 after the etching back is an isolation region 206. A top surface of the isolation region 206 is lower than top surfaces of the first semiconductor fin 221 and the second semiconductor fin 222. Subsequently, for example, as shown in FIG. 10E, the hard mask 1002 is removed. For example, the hard mask 1002 may be removed using dry etching.

Optionally, ion implantation adjustment may be performed through threshold voltage (Vt). For example, a sacrificial oxide layer may be formed at surfaces of portions of the various semiconductor fins that are located above the isolation region, then the ion implantation adjustment is performed through threshold voltage, and then the sacrificial oxide layer is removed.

Subsequently, dummy gate dielectric layers are formed at surfaces of portions of the various semiconductor fins that are located above the isolation region.

Figure 10F:
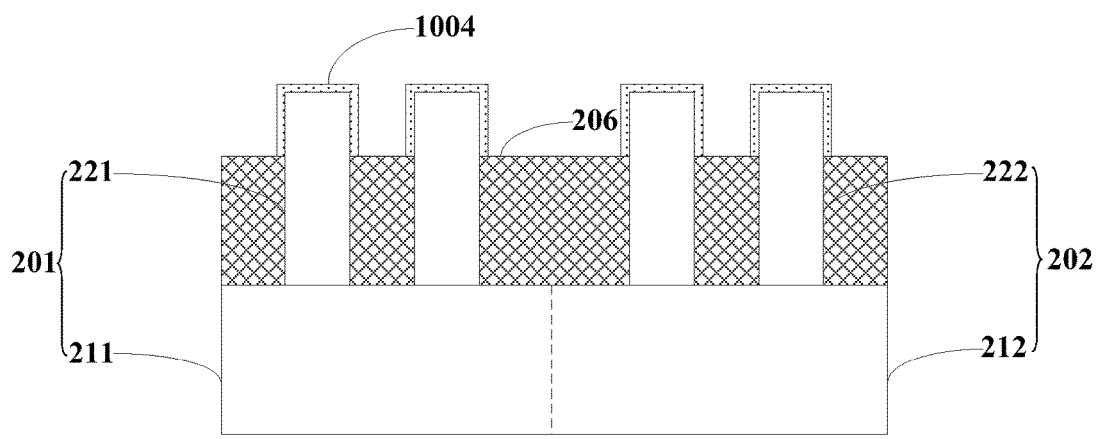

As shown in FIG. 10F, a dummy gate dielectric layer 1004, such as a silicon oxide layer, is formed at surfaces of portions of the first semiconductor fin 221 and the second semiconductor fin 222 that are located above the isolation region 206.

Subsequently, a dummy gate material is deposited, and the dummy gate material is patterned, so as to form a first dummy gate and a second dummy gate.

Figure 10G:
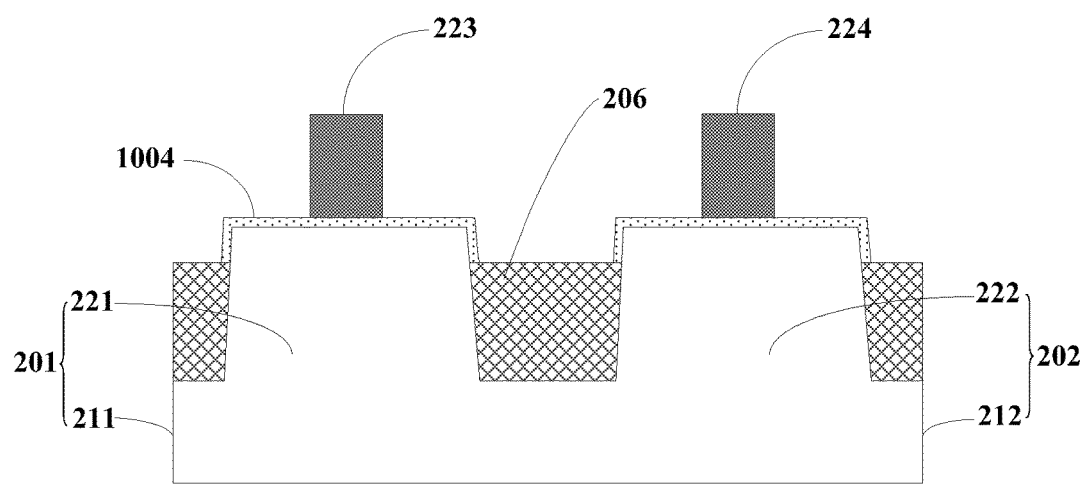

As shown in FIG. 10G, the dummy gate material, such as polysilicon, is deposited. Then, the dummy gate material is patterned. For example, a patterned hard mask is formed on the dummy gate material. Following this, the dummy gate material is etched using the hard mask as a mask and the dummy gate dielectric layer as a etch stop layer to form a first dummy gate 223 and a second dummy gate 224.

Figure 10H:
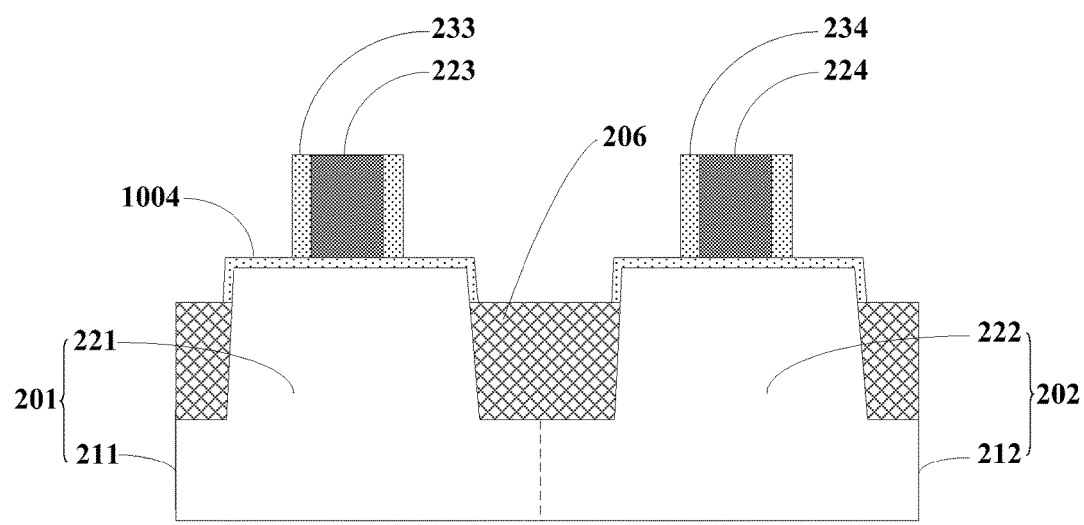

Subsequently, a first spacer layer 233, such as a nitride of silicon, is formed at a side wall of the first dummy gate 223. Moreover, a second spacer layer 234, such as a nitride of silicon, is formed at a side wall of the second dummy gate 224, as shown in FIG. 10H. For example, silicon nitride layers may be deposited at the structure shown in FIG. 10G, and then the deposited silicon nitride layers are etched. A silicon nitride layer at a side wall of the first dummy gate 223 remains as the first spacer layer 233, and a silicon nitride layer at a side wall of the second dummy gate 224 remains as the second spacer layer 234.

Figure 10I:
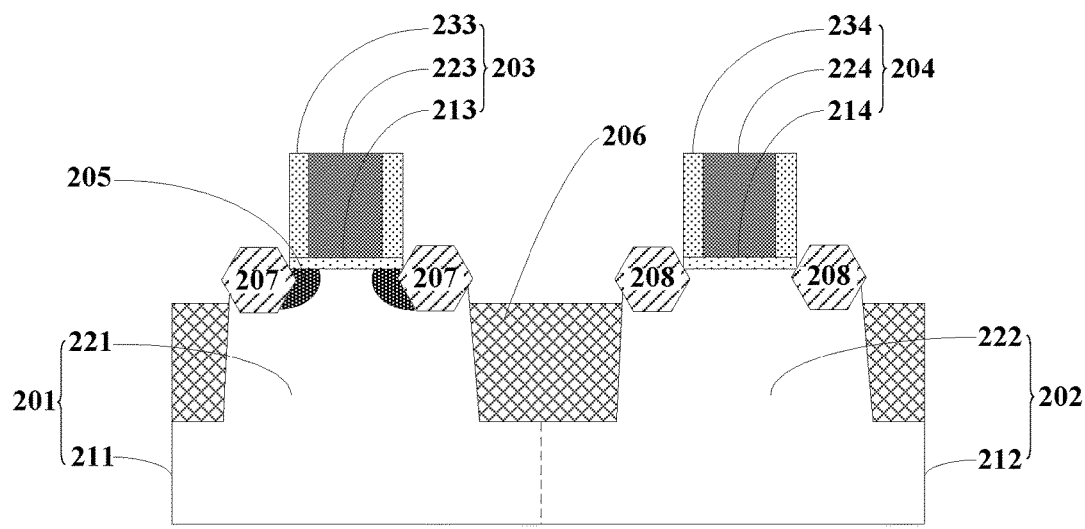

Subsequently, LDD injection is performed using the first spacer layer 233 as a mask, so as to form an LDD region 205, as shown in FIG. 10I. Subsequently, a portion of the first semiconductor fin 221 that is not covered by the first dummy gate structure 203 (including the dummy gate dielectric layer 1004 at a surface of the first semiconductor fin 221) is etched to form a recess. Then, a semiconductor material is epitaxially grown in the recess, thereby forming a raised first source/drain region 207.

Similarly, a part of the second semiconductor fin 222 that is not covered by the second gate structure 204 (including the dummy gate dielectric layer 1004 at a surface of the second semiconductor fin 222) is etched to form a recess. Then, a semiconductor material is epitaxially grown in the recess, thereby forming a raised second source/drain region 208. The remaining dummy gate dielectric layer which is on the first semiconductor fin 221 is used as the first dummy gate dielectric layer 213, and remaining dummy gate dielectric layer which is on the second semiconductor fin 222 is used as the second dummy gate dielectric layer 214.

Figure 10J:
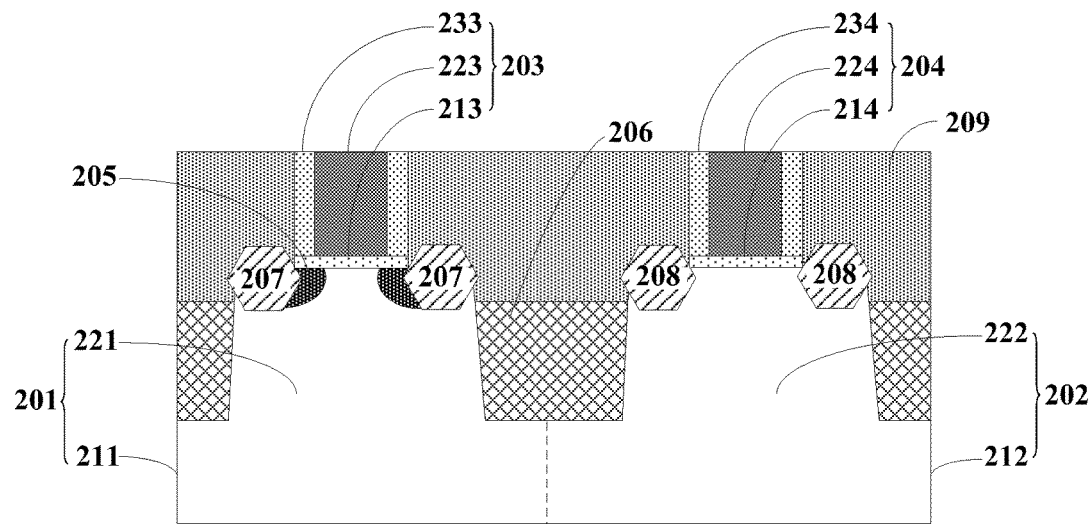

Subsequently, an interlayer dielectric layer 209, for example, boron phosphate silicate glass, is deposited on the structure shown in FIG. 10I (also called as a first structure). Then, the interlayer dielectric layer 209 is planarized, to expose the first dummy gate 223 and the second dummy gate 224, as shown in FIG. 10J. In other implementations, first, a contact etch stop layer (CESL) (not shown in the figures) may be deposited on the first structure shown in FIG. 10I, and then, the interlayer dielectric layer 209 is deposited on the CESL to apply expected stress to a device.

As mentioned above, the substrate structure shown in FIG. 2 is formed. Subsequent step 102 to step 110 may be executed according to the manner given above.

Figure 11:
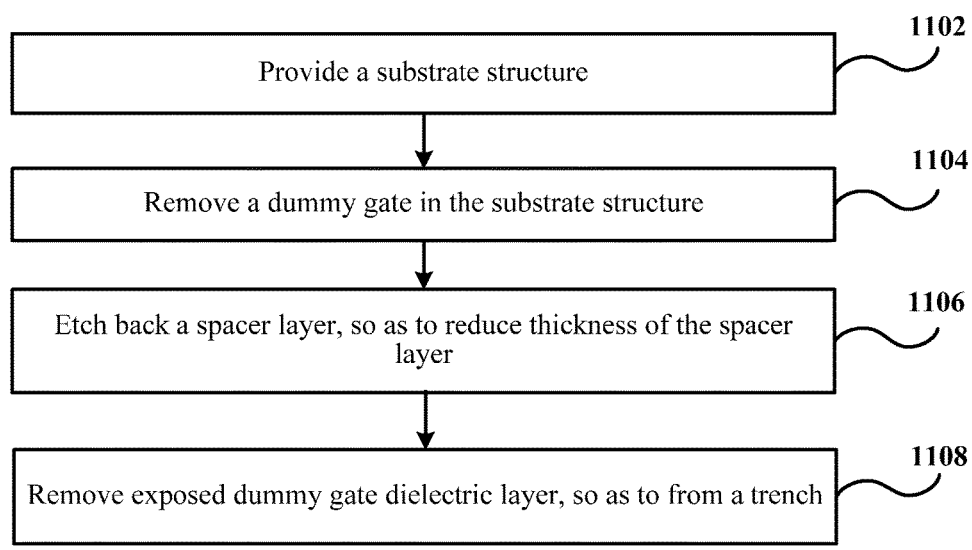
FIG. 11 is a simplified flowchart of a method for manufacturing a semiconductor device.

FIG. 11 is a simplified flowchart of a method for manufacturing a semiconductor device according to another embodiment of the present disclosure. As shown in FIG. 11, the method includes the following steps:

Step 1102, provide a substrate structure. The substrate structure includes: a substrate, for example, a semiconductor substrate made of silicon; a dummy gate structure on the substrate; and a Lightly Doped Drain (LDD) region below the dummy gate structure. The dummy gate structure includes a dummy gate dielectric layer (such as an oxide of silicon) on the substrate, a dummy gate (such as polysilicon) on the dummy gate dielectric layer, and a spacer layer (such as a nitride of silicon) at a side wall of the dummy gate. In some implementations, the substrate may include a semiconductor region and a semiconductor fin at the semiconductor region, and the dummy gate structure spans over the semiconductor fin.

Step 1104, remove the dummy gate, so as to expose the spacer layer.

Step 1106, etch back the spacer layer, so as to reduce a thickness of the spacer layer.

Step 1108, remove exposed dummy gate dielectric layer, so as to form a trench. It should be understood that when removing the exposed dummy gate dielectric layer, a part of the dummy gate dielectric layer which is located below the spacer layer may also be removed.

In this implementation, a thickness of the spacer layer is reduced by etching it back after the dummy gate is removed, so that in a case in which thermal budget is not added, an overlapping area of a channel region and an LDD region of a device after a gate electrode is subsequently formed may be increased, so as to improve reliability of the device.

In some implementations, a gate structure may be formed in the formed channel.

Above, a semiconductor device and a manufacturing method therefor according to the implementations of the present disclosure are described in detail. In describing the present disclosure, some details generally known in the art are not described. According to the foregoing description, a person skilled in the art may completely understand how to implement the technical solutions disclosed herein. In addition, the embodiments and implementations according to the teaching disclosed in the specification may be freely combined. A person skilled in the art should understand that various amendments may be made to the embodiments and implementations described above without departing from the spirit and scope of the present disclosure that are defined by the appended claims.

What is claimed is:

1. A method for manufacturing a semiconductor device, comprising:
    providing a substrate structure, wherein the substrate structure comprises:
        a substrate having a first device region and a second device region,
        a first dummy gate structure at the first device region,
        a second dummy gate structure at the second device region, and
        a Lightly Doped Drain (LDD) region below the first dummy gate structure,
        wherein the first dummy gate structure comprises:
            a first dummy gate dielectric layer at the first device region,
            a first dummy gate on the first dummy gate dielectric layer, and
            a first spacer layer at a side wall of the first dummy gate, and
        wherein the second dummy gate structure comprises:
            a second dummy gate dielectric layer at the second device region,
            a second dummy gate on the second dummy gate dielectric layer, and
            a second spacer layer at a side wall of the second dummy gate;
    removing the first dummy gate;
    etching back the first spacer layer to reduce a thickness of the first spacer layer such that the thickness of the first spacer layer is smaller than a thickness of the second spacer layer;
    removing an exposed portion of the first dummy gate dielectric layer to form a first trench;
    removing the second dummy gate after removing the first dummy gate;
    removing an exposed portion of the second dummy gate dielectric layer to form a second trench;
    depositing a gate dielectric layer to cover a bottom portion and a side wall of the first trench and a bottom portion and a side wall of the second trench; and
    before depositing the gate dielectric layer, forming a gate oxide layer only at the bottom portion of the first trench.

2. The method according to claim 1, further comprising:
    depositing a gate material on the gate dielectric layer.

3. The method according to claim 2, further comprising:
    before depositing the gate dielectric layer, forming an interface layer at the bottom portion of the first trench and the bottom portion of the second trench.

4. The method according to claim 1, wherein the first device region comprises an input/output (I/O) device region, and the second device region comprises a core device region.

5. The method according to claim 1, wherein
    the first device region comprises a first semiconductor region and a first semiconductor fin at the first semiconductor region; and
    the second device region comprises a second semiconductor region and a second semiconductor fin at the second semiconductor region,
    wherein the first dummy gate structure spans over the first semiconductor fin and the second dummy gate structure spans over the second semiconductor fin.

6. The method according to claim 5, wherein steps of providing the substrate structure comprise:
   providing an initial substrate;
   etching the initial substrate to form the first device region and the second device region;
   forming an isolation region between one or more semiconductor fins, wherein a top surface of the isolation region is lower than a top surface of each semiconductor fin;
   forming dummy gate dielectric layers at surfaces of portions of the one or more semiconductor fins that are located above the isolation region;
   depositing a dummy gate material and patterning the dummy gate material to form the first dummy gate and the second dummy gate;
   forming the first spacer layer at a side wall of the first dummy gate, and forming the second spacer layer at a side wall of the second dummy gate;
   performing LDD injection by using the first spacer layer as a mask to form the LDD region, so as to form a first structure;
   depositing an interlayer dielectric layer on the first structure; and
   planarizing the interlayer dielectric layer to expose the first dummy gate and the second dummy gate.

7. The method according to claim 6, wherein depositing the interlayer dielectric layer on the first structure comprises:
   depositing a contact etch stop layer on the first structure; and
   depositing the interlayer dielectric layer on the contact etch stop layer.

\* \* \* \* \*